United States Patent
Morishita

(10) Patent No.: US 8,493,698 B2
(45) Date of Patent: Jul. 23, 2013

(54) ELECTROSTATIC DISCHARGE PROTECTION CIRCUIT

(75) Inventor: Yasuyuki Morishita, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 158 days.

(21) Appl. No.: 12/801,098

(22) Filed: May 21, 2010

(65) Prior Publication Data

US 2010/0302694 A1    Dec. 2, 2010

(30) Foreign Application Priority Data

May 27, 2009 (JP) ................................ 2009-127426

(51) Int. Cl.
*H02H 9/00* (2006.01)

(52) U.S. Cl.
USPC ............................................ 361/56; 361/111

(58) Field of Classification Search
None
See application file for complete search history.

(56) References Cited

U.S. PATENT DOCUMENTS

| 5,977,595 | A | * | 11/1999 | Ham ............................... 257/358 |
| 5,991,134 | A | * | 11/1999 | Tan et al. ......................... 361/111 |
| 6,385,021 | B1 | | 5/2002 | Takeda et al. |
| 6,552,594 | B2 | * | 4/2003 | Lin ................................. 327/310 |
| 6,724,603 | B2 | * | 4/2004 | Miller et al. .................... 361/111 |
| 8,144,441 | B2 | * | 3/2012 | Ping et al. ........................ 361/56 |
| 2003/0043517 | A1 | * | 3/2003 | Tsuji et al. ....................... 361/56 |
| 2007/0120498 | A1 | * | 5/2007 | Caiafa et al. .................. 315/248 |

* cited by examiner

*Primary Examiner* — Jared Fureman
*Assistant Examiner* — Terrence Willoughby
(74) *Attorney, Agent, or Firm* — McGinn IP Law Group, PLLC

(57) ABSTRACT

It is desired to achieve a high ESD protection performance by a small area circuit. An electrostatic discharge protection circuit includes: protection circuits, wherein each protection circuit includes a MOS transistor; and a trigger circuit configured to supply a trigger signal to a gate electrode of the MOS transistor of each protection circuit in response to a surge voltage between a low potential node and a high potential node. Each protection circuit is configured to electrically connect the low potential node and the high potential node to one another when the trigger signal is supplied to the gate electrode. The gate electrode of each protection circuit is connected to a resistive element having larger resistance value than Rmax, supposing that Rmax is a largest parasitic resistance between each of the plurality of protection circuit and an output of the trigger circuit.

14 Claims, 5 Drawing Sheets

ELECTROSTATIC DISCHARGE PROTECTION CIRCUIT

INCORPORATION BY REFERENCE

This patent application is based on Japanese Patent Application No. 2009-127426. The disclosure of the Japanese Patent Application is incorporated herein by reference.

BACKGROUND OF THE INVENTION

1. Field of the Invention

The present invention relates to a technique for protecting a semiconductor device from electrostatic discharge.

2. Description of Related Art

In semiconductor devices, an ESD (Electrostatic Discharge) protection circuit for protecting circuits from ESD is mounted. The ESD protection circuit is provided with a trigger circuit and a discharge circuit. The trigger circuit generates a trigger signal in response to a surge voltage to supply it to the discharge circuit. The discharge circuit conducts a current from a power source line to a ground line in response to the trigger signal so as to protect a protection target circuit from being applied with an overcurrent and an overvoltage.

The ESD protection circuit is generally provided with a plurality of discharge circuits. The plurality of discharge circuits is arranged in various portions of a semiconductor device. The discharge circuits have their own delay times that are different from one another due to parasitic resistances thereof. The timing for discharge by each of the plurality of discharge circuits is shifted due to differences in the delay time, which may influence performance of the ESD protection circuit. In such a case, a buffer circuit can be provided in each of the discharge circuits to reduce the differences in the delay time.

U.S. Pat. No. 6,385,021 is an example of the ESD protection circuit which is referred to as Patent Document 1.

SUMMARY

As semiconductor devices become smaller and their integration degree becomes higher in recent years, it is required to downsize the area of the circuit. In particular, since the switching element used in a discharge circuit is required to be large in size to some extent, circuits other than the switching elements are required to be smaller in order to prevent increase in the area of the discharge circuit. Then, the inventor of the present invention has become aware that, in technique disclosed in Patent Document 1, it may be possible to reduce the size of a buffer circuit provided in each discharge circuit.

According to an aspect of the present invention, an electrostatic discharge protection circuit includes: a plurality of protection circuits, wherein each of the plurality of protection circuits includes a MOS transistor; and a trigger circuit configured to supply a trigger signal to a gate electrode of the MOS transistor of each of the plurality of protection circuits in response to a surge voltage between a low potential node and a high potential node. Each of the plurality of protection circuits is configured to electrically connect the low potential node and the high potential node to one another when the trigger signal is supplied to the gate electrode. The gate electrode of each of the plurality of protection circuits is connected to a resistive element having larger resistance value than Rmax, supposing that Rmax is a largest parasitic resistance between each of the plurality of protection circuit and an output of the trigger circuit.

The present invention makes it possible to prevent increase in the area of a discharge circuit, while reducing the difference in delay time among a plurality of discharge circuits.

BRIEF DESCRIPTION OF THE DRAWINGS

The above and other objects, advantages and features of the present invention will be more apparent from the following description of certain preferred embodiments taken in conjunction with the accompanying drawings, in which.

DESCRIPTION OF THE PREFERRED EMBODIMENTS

Figure 1:
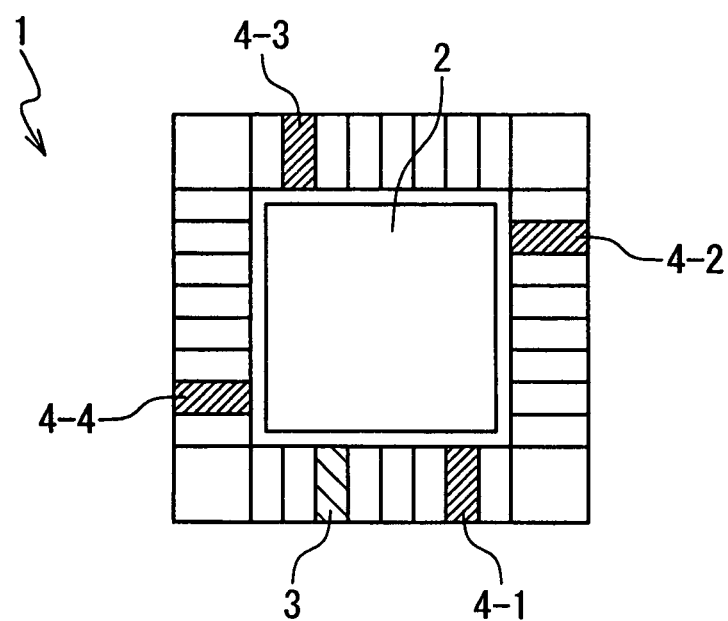
FIG. 1 is a top plan view of a semiconductor device.

Hereinafter, some exemplary embodiments of the present invention will be described below referring to the accompanying drawings. FIG. 1 is a top plan view of a semiconductor device according to an embodiment of the present invention. A semiconductor device 1 is typically an LSI (Large Scale Integration circuit). The semiconductor device 1 has a protection target circuit 2. The protection target circuit 2 is surrounded by a lot of slots such as a power source slot formed therearound for supplying power to the protection target circuit 2. The slots include at least one trigger circuit 3 and a plurality of protection circuits (protection element slots) 4-1 to 4-4. The number of the protection circuits 4-1 to 4-4 is determined as appropriate in accordance with the design of the semiconductor device 1.

Figure 2:
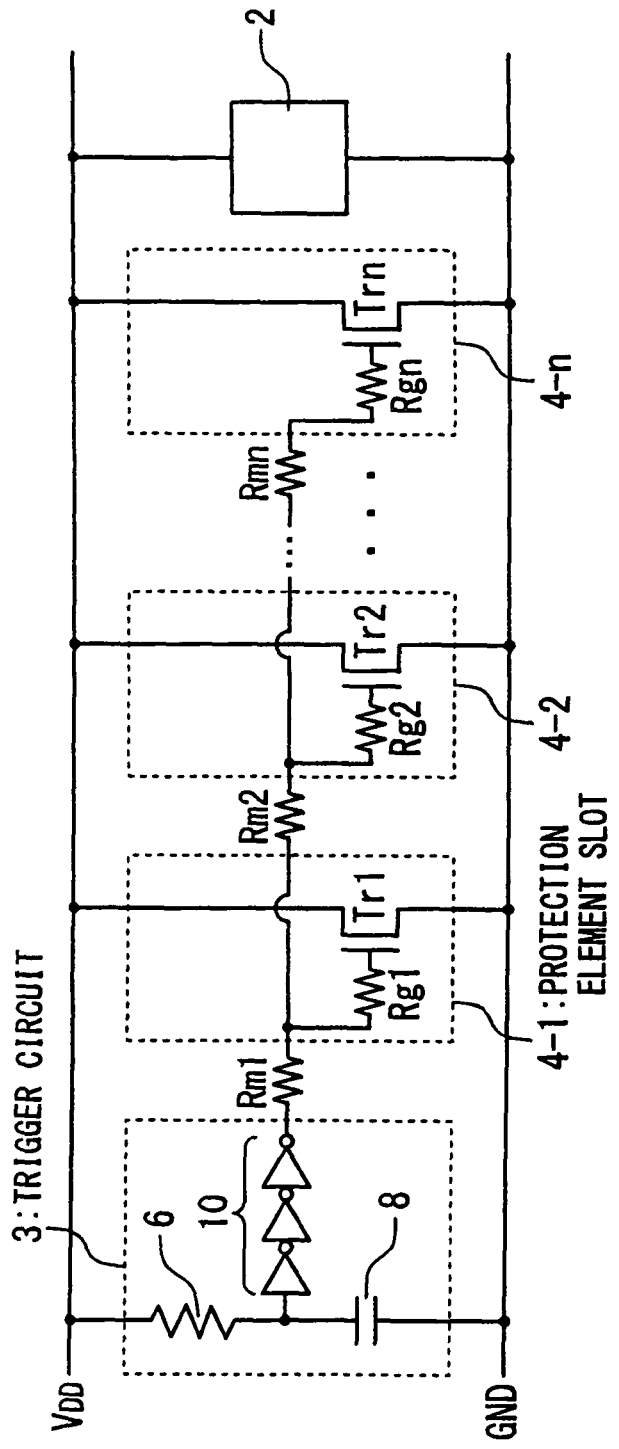
FIG. 2 shows a configuration of a trigger circuit and a plurality of protection circuits.

FIG. 2 shows a configuration of the trigger circuit 3 and a plurality of protection circuits 4-1 to 4-n (n is an integer of 2 or larger). A ground line GND and a power source line VDD for supplying power are connected to the protection target circuit 2.

The trigger circuit 3 is connected between the ground line GND and the power source line VDD. The ground line GND provides a low potential node, and the power source line VDD provides a high potential node. The trigger circuit 3 is provided with a resistive element 6, a capacitive element 8 and a buffer 10. The resistive element 6 is connected to the power source line VDD at one end, and the other end thereof is connected to an input node of the buffer 10. The capacitive element 8 is connected to the input node of the buffer 10 at one end, and the other end thereof is connected to the ground line GND. The buffer 10 is configured by an odd-numbered (three in the example shown in FIG. 2) inverters connected in series.

Each of the plurality of protection circuits 4-1 to 4-n has a configuration similar to one another. The protection circuit 4-j (j referring to any one of integers of 1 to n) is provided with an NMOS transistor Trj. The source of Trj is connected to the ground line GND. The drain of Trj is connected to the power source line VDD. The gate of Trj is connected to one end of a resistive element Rgj provided for reducing the difference in the delay time. The other end of the resistive element Rgj is connected to an output node of the trigger circuit 3, i.e., an output node of the buffer 10. Rm1 to Rmn show parasitic resistances between the trigger circuit 3 and each of the protection circuits 4-1 to 4-n, respectively. In the example shown in FIG. 2, the plurality of protection circuits 4-1 to 4-n is connected in parallel to one another to a common line that is connected to the output node of the trigger circuit 3. The plurality of protection circuits 4-1 to 4-n, however, may be connected to the output node in any wiring pattern. In addition, the means adapted to reducing the difference in the delay time described in the present embodiment is of course applicable to a protection circuit in which a PMOS transistor is employed as a switching element for discharging.

Figure 3:
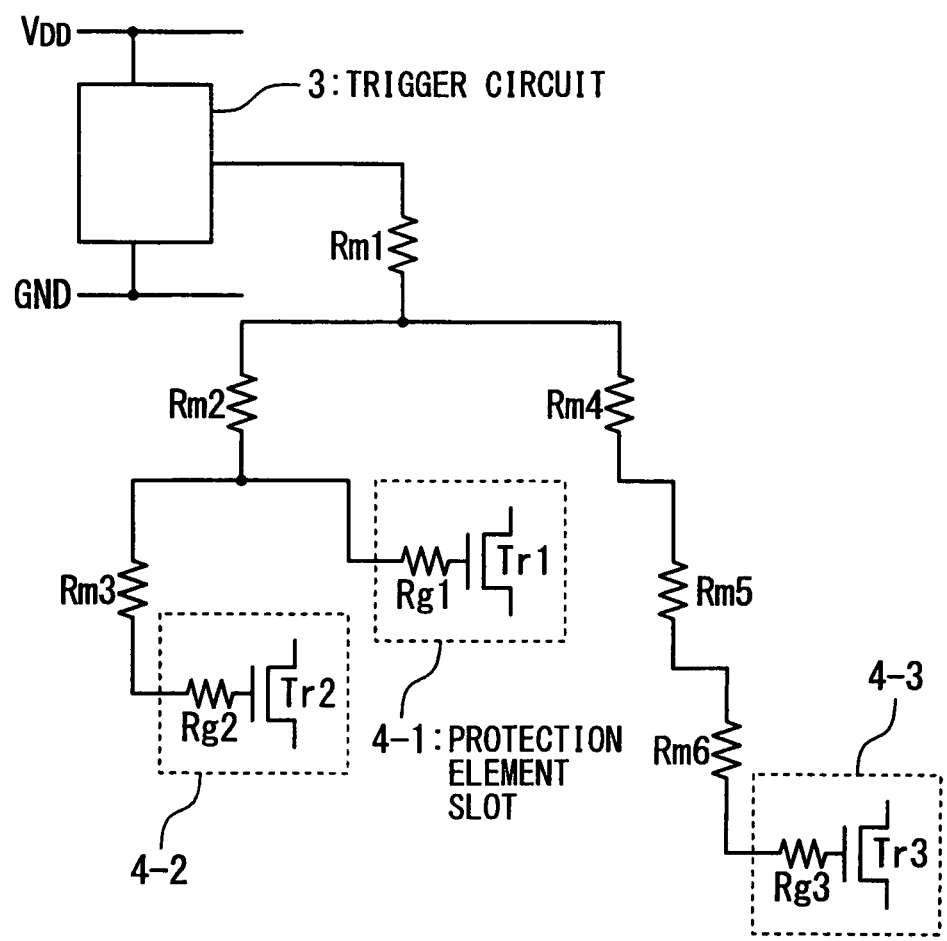
FIG. 3 shows an example of a pattern of wirings connecting a trigger circuit to protection circuits.

Next, a resistance value of the resistive element Rgj will be described. FIG. 3 shows an example of a pattern of a connection wiring between the trigger circuit 3 and each of the protection circuits 4-1 to 4-3. Although this example includes three protection circuits 4-1 to 4-3, the explanation described below is applicable to cases of including any number of protection circuits. The resistive element Rg1 of the first protection circuit 4-1 is connected to the output node of the trigger circuit 3 via the parasitic resistances Rm1 and Rm2 connected in series. The resistive element Rg2 of the second protection circuit 4-2 is connected to the output node of the trigger circuit 3 via the parasitic resistances Rm1, Rm2 and Rm3 connected in series. The resistive element Rg3 of the third protection circuit 4-3 is connected to the output node of the trigger circuit 3 via the parasitic resistances Rm1, Rm4, Rm5 and Rm6 connected in series.

When designing the semiconductor device 1 as described above, a designer determines an arrangement of the trigger circuit 3 and the protection circuits 4-1 to 4-3 onto the slots of the semiconductor device 1, and routing of the wirings connecting thereamong. Then, the parasitic resistance value between the trigger circuit 3 and each of the plurality of protection circuits 4-1 to 4-3 is calculated. The maximum parasitic resistance value Rmax is extracted from the calculated parasitic resistance values for use in determining the resistance values of the respective resistive elements Rg1 to Rg3 provided for each of the protection circuits. In the example in FIG. 3, the total of the parasitic resistances Rm1+Rm4+Rm5+Rm6 of the connection wiring of the protection circuit 4-3 is assumed to be the maximum parasitic resistance value Rmax. Each of the resistance values of the resistive elements Rg1 to Rg3 is determined to be larger than the maximum parasitic resistance value Rmax. It is preferred that each of the resistance values of the resistive elements Rg1 to Rg3 is larger than Rmax at 10 times or more. For example, the resistance values of the resistive elements Rg1 to Rg3 are determined to be the values 10 to 100 times as much as Rmax. It is preferred that the resistance values of the resistive elements Rg1 to Rg3 of the protection circuits 4-1 to 4-3 are same to one another. A sheet resistance value may be used to determine the resistance values of the resistive elements Rg1 to Rg3 described above. Namely, each of sheet resistance values of the resistive elements Rg1 to Rg3 may be set to be larger than the maximum parasitic resistance of the sheet resistance value.

Next, an operation of the semiconductor device 1 will be described. When electrostatic discharge generates a pulsing surge voltage between the ground line GND and the power source line VDD in the semiconductor device 1, the trigger circuit 3 outputs a trigger signal during a time determined by the RC time constant of the resistive element 6 and the capacitive element 8. The trigger signal is intensified by the buffer 10. The trigger signal is supplied to each of the protection circuits 4-1 to 4-n. In each protection circuit 4-j (j referring to any one of integers of 1 to n), the NMOS transistor Trj is turned on in response to the trigger signal so that the power source line VDD and the ground line GND are electrically connected to one another, thereby flowing a current from the power source line VDD to the ground line GND. The protection target circuit 2 is thus protected from the ESD affection.

In the trigger signals distributed to the protection circuits 4-1 to 4-n, differences in the delay time occur due to the influence of the parasitic resistances Rm1 to Rmn. However, gate electrodes of the switching elements (the transistors Tr1 to Trn) of protection element slots 4-1 to 4-n are connected with the resistive elements each having the resistance value larger than the maximum parasitic resistance Rmax. Therefore, the difference in the delay time is reduced, and thus each of the plurality of protection circuits 4-1 to 4-n can discharge the surge current approximately at the same time.

Since the parasitic resistance Rmax is typically less than or on the order of some ohms, the resistance values determined to be tens to hundreds ohms are sufficient for the resistive elements Rg1 to Rg3. The resistive element having the value of this order can be realized with smaller area than that of the buffer circuit realized by, for example, an inverter. Therefore, it is possible to achieve high ESD protection performance by the protection circuits 4-1 to 4-n each having a small area. Moreover, the additional circuit (the resistive element Rg1 to Rg3) for reducing the difference in delay time is simple, so that the design therefor is easy.

Figure 4:
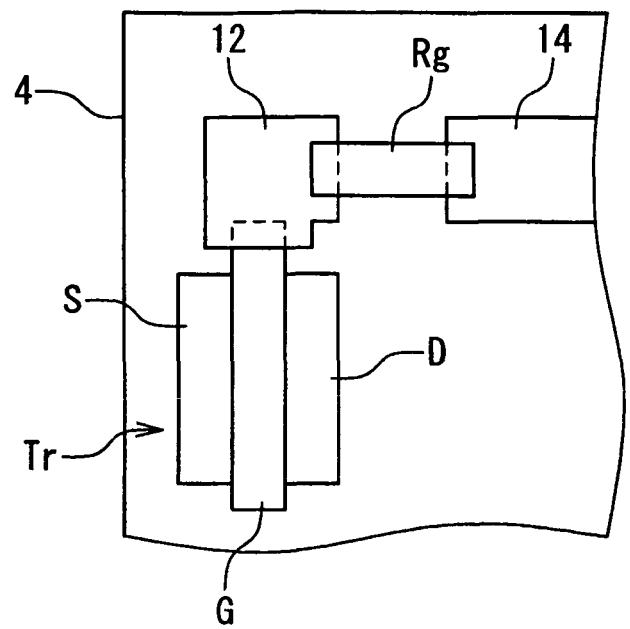
FIG. 4 is a top plan view showing a configuration example of a gate electrode and a resistive element in the protection circuit.

FIG. 4 is a top plan view showing a configuration example of the gate electrode G of the transistor Tr that is the switching element and a resistive element Rg in the protection circuit 4 (corresponding to any one of the protection circuits 4-1 to 4-n in FIG. 2). The gate electrode G is connected with one end of a conductive member 12 at a different side from the source S and the drain D. The other end of the conductive member 12 is connected to one end of the resistive element Rg. The other end of the resistive element Rg is connected to a wiring 14 formed by a conductive member. The trigger signal generated by the trigger circuit 3 is supplied from the wiring 14 to the gate electrode G via the resistive element Rg and the conductive member 12. The resistive element Rg can be formed, for example, by polysilicon whose surface is not silicided.

Figure 5:
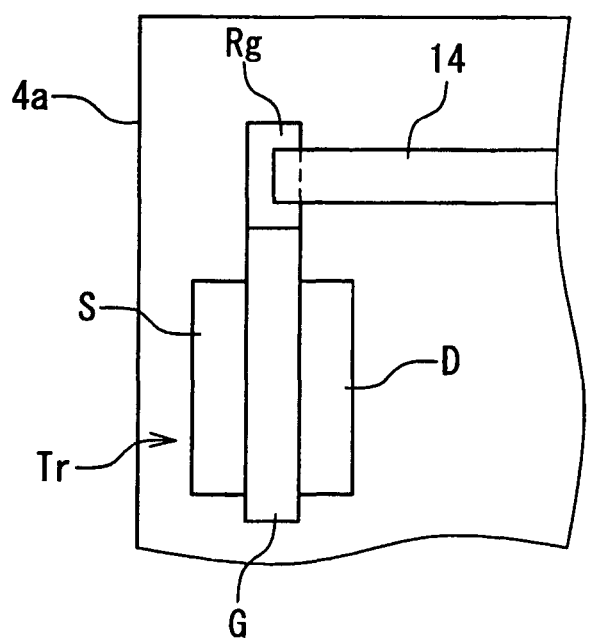
FIG. 5 is a top plan view of a protection circuit showing a configuration example of a gate electrode and a resistive element.

FIG. 5 is a top plan view of a protection circuit 4a showing another configuration example of the gate electrode G of the transistor Tr and the resistive element Rg. In the member constituting the gate electrode G, a channel formed between the source and the drain D includes an upper region whose surface is silicided. In contrast, in the member constituting the gate electrode G, a region, which is set on a side different form the source and the drain D to be connected to the wiring 14, includes the surface that is not silicided. As described above, a part of the member made of a single material is not silicided, and thus it is possible to apply a function as the resistive element Rg with a simple configuration.

Figure 6:
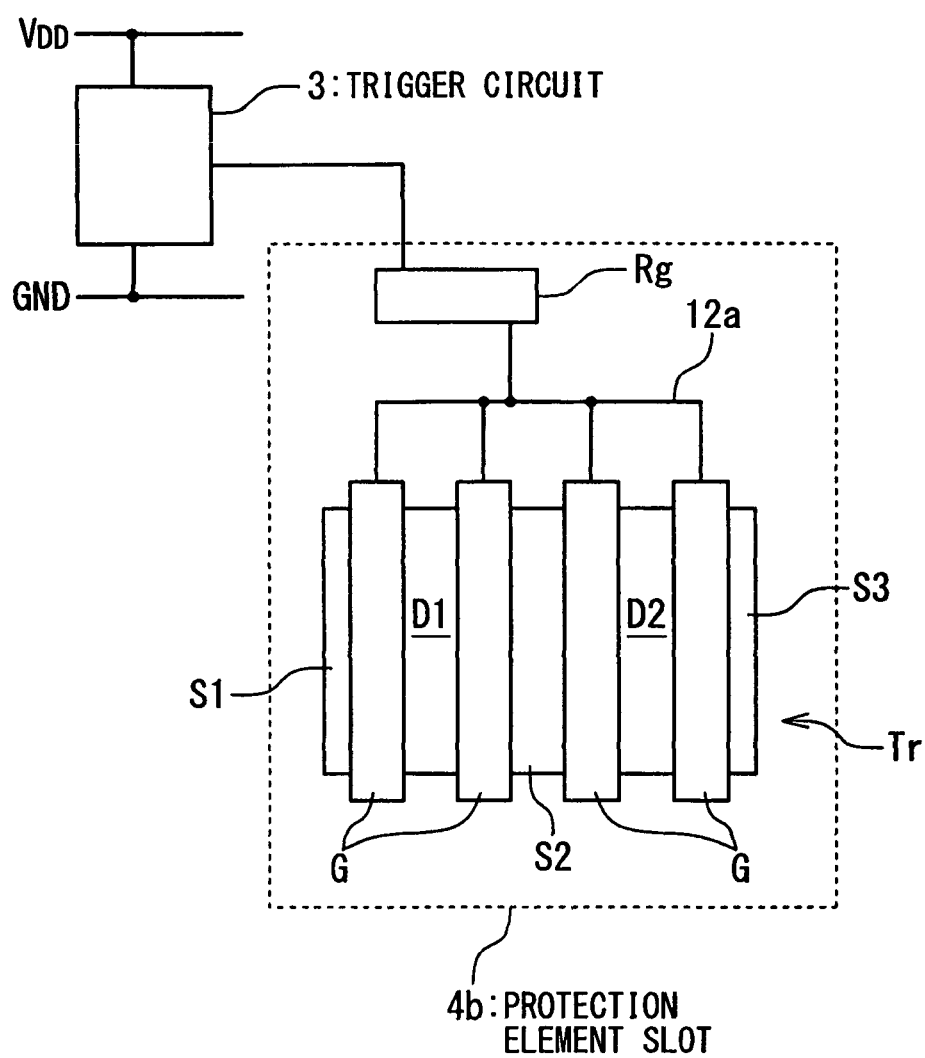
FIG. 6 is a top plan view of the protection circuit showing a configuration example of gate electrodes and a resistive element in a transistor.

FIG. 6 is a top plan view of a protection circuit 4b showing still another configuration example of the gate electrode G of the transistor Tr and the resistive element Rg. The transistor Tr in this configuration example includes a plurality of gates G each formed in parallel with one another. A plurality of sources S1, S2 and S3 and a plurality of drains D1 and D2 are alternately arranged. The source and the drain adjacent to each other are positioned across a gate electrode. Namely, each of the gates G is positioned on the channel between a source and a drain adjacent to each other. The ESD protection circuit may employ the transistor having such a configuration in order to flow a large current. In the transistor Tr having such a configuration, it is enough to form the resistive element Rg shared by the plurality of gates G. End portions of each of the plurality of gates G are connected to one end of the shared resistive element Rg in parallel via the conductive member 12a. Such a configuration can reduce the difference in delay time by preparing smaller number of resistive elements Rg than that of the gates contained in a single protection circuit. Therefore, the area of the protection circuit can be reduced.

Although the present invention has been described above in connection with several embodiments thereof, it would be apparent to those skilled in the art that those embodiments are provided solely for illustrating the present invention, and should not be relied upon to construe the appended claims in a limiting sense.

What is claimed is:

1. An electrostatic discharge protection circuit comprising:
   a plurality of protection circuits, wherein each of the plurality of protection circuits includes a MOS transistor; and
   a trigger circuit configured to supply a trigger signal to a gate electrode of the MOS transistor of each of the plurality of protection circuits in response to a surge voltage between a low potential node and a high potential node,
   wherein each of the plurality of protection circuits is configured to electrically connect the low potential node and the high potential node to one another when the trigger signal is supplied to the gate electrode of the MOS transistor,
   wherein the gate electrode of the MOS transistor of each of the plurality of protection circuits is connected to a resistive element having a larger resistance value than Rmax,
   wherein Rmax is a largest parasitic resistance between each protection circuit of the plurality of protection circuits and an output of the trigger circuit, and
   wherein the MOS transistor of a predetermined protection circuit among the plurality of protection circuits includes:
      a plurality of gate electrodes;
      a plurality of source electrodes; and
      a plurality of drain electrodes respectively adjacent to one of the plurality of source electrodes across from one of the plurality of gate electrodes,
      the plurality of gate electrodes being connected in series to the resistive element.

2. The electrostatic discharge protection circuit according to claim 1, wherein each of the plurality of protection circuits comprises a conductive member having a first end connected to the gate electrode, and a second end connected to the resistive element.

3. The electrostatic discharge protection circuit according to claim 1, wherein the gate electrode of the MOS transistor of each protection circuit of the plurality of protection circuits is formed by a material obtained by siliciding the material forming the resistive element.

4. An integrated circuit chip comprising:
   the electrostatic discharge protection circuit according to claim 1; and
   a protection target circuit connected in parallel to the electrostatic discharge protection circuit and configured to use the low potential node and the high potential node.

5. The electrostatic discharge protection circuit according to claim 1, wherein the gate electrode comprises a silicided surface.

6. The electrostatic discharge protection circuit according to claim 1, wherein the resistive element comprises a resistance value that is 10 times or more greater than Rmax.

7. The electrostatic discharge protection circuit according to claim 1, wherein the trigger circuit comprises a resistive element and a capacitive element, the resistive element and the capacitive element having an RC time constant, and
   wherein the RC time constant determines a duration that the trigger circuit outputs the trigger signal.

8. The electrostatic discharge protection circuit according to claim 1, wherein the trigger circuit comprises a buffer that amplifies the trigger signal.

9. The electrostatic discharge protection circuit according to claim 1, wherein the gate electrode of the MOS transistor of each of the plurality of protection circuits comprises the resistive element.

10. The electrostatic discharge protection circuit according to claim 9, wherein the gate electrode is partially silicided.

11. The electrostatic discharge protection circuit according to claim 1, wherein the plurality of protection circuits comprises:
    a first protection circuit connected through a first parasitic resistance to the output of the trigger circuit; and
    a second protection circuit connected through a second parasitic resistance to the output of the trigger circuit.

12. The electrostatic discharge protection circuit according to claim 11, wherein the second parasitic resistance comprises a first end connected to the resistive element of the second protection circuit and a second end connected to the first parasitic resistance.

13. The electrostatic discharge protection circuit according to claim 11, wherein the output of the trigger circuit is connected in series to the first parasitic resistance and the second parasitic resistance.

14. The electrostatic discharge protection circuit according to claim 1, wherein the resistive element of each of the plurality of protection circuits comprises substantially a same resistance.

* * * * *